United States Patent [19]

Konii et al.

[11] 4,229,330
[45] Oct. 21, 1980

[54] PROCESS FOR PRODUCING PHENOLIC RESINS

[75] Inventors: Susumu Konii, Tokyo; Yukio Yoshimura, Saitama-ken; Ken Nanaumi, Shimodate; Kohei Yasuzawa, Shimodate; Takeshi Yoshida, Shimodate; Toyotaro Shinko, Shimodate, all of Japan

[73] Assignee: Hitachi Chemical Company, Ltd., Japan

[21] Appl. No.: 937,114

[22] Filed: Aug. 28, 1978

[30] Foreign Application Priority Data

Aug. 29, 1977 [JP] Japan ................................. 52/104035
Aug. 29, 1977 [JP] Japan ................................. 52/104037

[51] Int. Cl.$^2$ ............................................. C08G 8/32
[52] U.S. Cl. ................................. 260/19 R; 427/101; 428/460; 428/531
[58] Field of Search ................ 260/19 EP, 19 R; 427/101; 428/460, 531

[56] References Cited

U.S. PATENT DOCUMENTS

| 1,947,415 | 2/1934 | Heck | 260/19 R |
| 3,256,222 | 6/1966 | Dalibor et al. | 260/19 EP |
| 3,947,393 | 3/1976 | Sato et al. | 260/19 R |

FOREIGN PATENT DOCUMENTS 996101  6/1965  United Kingdom .
1328048  8/1973  United Kingdom .

Primary Examiner—Ronald W. Griffin
Attorney, Agent, or Firm—Craig & Antonelli

[57] ABSTRACT

Internally plasticized phenolic resins suitable for use in preparing laminates and the like excellent in electrical properties, heat resistance, solvent resistance as well as punchability are produced by reacting a compound of the formula:

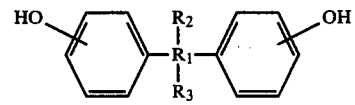

wherein $R_1$ is an alkylene residue having 1 to 3 carbon atoms; and $R_2$ and $R_3$ are independently hydrogen or a saturated or unsaturated hydrocarbon group having 1 to 3 carbon atoms, with an epoxidized vegetable oil with heating in the presence of one or more secondary and/or tertiary amines, and adding formaldehyde or one or more phenols and formaldehyde to the reaction system to further proceed the reaction.

20 Claims, No Drawings

PROCESS FOR PRODUCING PHENOLIC RESINS

This invention relates to a process for producing internally plasticized phenolic resins suitable for use in preparing laminates and the like excellent in electrical properties, heat resistance, solvent resistance and particularly excellent in punchability.

Recently, laminates used for insulating materials, particularly used for communications equipment and electronic equipment, have been required to be excellent in punchability at normal or relatively low temperatures, that is, so-called cold punchability, from the viewpoint of automating and reduction of labor. In order to attain such a purpose, there have been proposed various methods, e.g. using phenol in combination with an alkylated phenol, using such a modifier as drying or semi-drying vegetable oils, etc. in order to increase flexibility of phenolic resins. But these methods have various defects in that, in the case of using the alkylated phenol, cold punchability is insufficient, and in the case of using the vegetable oil, due to relatively slow reaction between the double bonds of the vegetable oil and the phenols, unreacted vegetable oil is retained in the resin as they are, which results in lowering in heat resistance of laminates, gelation caused by polymerization between the double bonds of unreacted vegetable oil with each other, and various problems in workability during the manufacturing. In order to improve such defects, methods for using epoxidized vegetable oils have been proposed (British Pat. No. 996,101, U.S. Pat. No. 3,256,222, German Offenlegungsschrift No. 2,225,458, etc.). But according to these methods, not only in the case of using phenol monomer but also in the case of using a resol or novolac type phenol-formaldehyde resin, the hydroxyl groups of unreacted phenol in the resin react with the epoxy groups of the epoxidized vegetable oil preferentially to make the phenol nucleus itself inactive to formaldehyde. Since the thus produced reaction product between phenol and the epoxidized vegetable oil remains in the resin uncured, punchability of laminates may be improved but other properties such as heat resistance, solvent resistance and the like are insufficient.

It is an object of the present invention to provide a process for producing internally plasticized phenolic resins suitable for use in preparing laminates and the like excellent in punchability as well as electrical properties, heat resistance and solvent resistance.

The present invention provides a process for producing an internally plasticized phenolic resin which comprises reacting a compound of the formula:

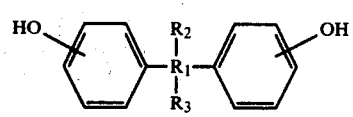

wherein $R_1$ is an alkylene residue having 1 to 3 carbon atoms; and $R_2$ and $R_3$ are independently hydrogen or a saturated or unsaturated hydrocarbon group having 1 to 3 carbon atoms, with an epoxidized vegetable oil with heating in the presence of one or more secondary and/or tertiary amines, and adding formaldehyde or one or more phenols and formaldehyde to the reaction system to further proceed the reaction.

The compound of the formula (I) is a so-called bisphenol. The bisphenol can also be represented by the formula:

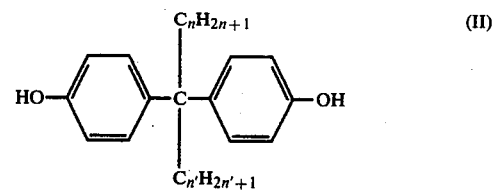

wherein n and n' are independently zero or an integer of 1 to 4. Examples of the compounds of the formula (I) are 4,4'-dihydroxydiphenylpropane-2,2 (bisphenol A), 4,4'-dihydroxydiphenylmethane (bisphenol F), 4,4'-dihydroxydiphenylcyclohexane, 4,4'-dihydroxydiphenylpentane-3,3,4,4'-dihydroxydiphenylbutane-2,2 2-(4-hydroxyphenyl)-4-methyl-4-(4-hydroxyphenyl)-pentene-1, and the like. Among them, bisphenol A, bisphenol F, and 2-(4-hydroxyphenyl)-4-methyl-4-(4-hydroxyphenyl)-pentene-1 are preferable.

As the epoxidized vegetable oil, that having an oxirane oxygen content of 2-8% is preferable. Examples of the epoxidized vegetable oils are epoxidized linseed oil, epoxidized soya bean oil, epoxidized castor oil, epoxidized dehydrated castor oil, and the like. Among them, epoxidized soya bean oil and epoxidized linseed oil are preferable. Particularly, when epoxidized soya bean oil is used, since the epoxy group content in the oil is relatively small, the reaction proceeds mildly so as to produce a varnish stably.

The secondary and tertiary amines are used in the process of the present invention as catalysts. Examples of the secondary amines are dimethylamine, diethylamine, dipropylamine, dibutylamine, diallylamine, diamylamine, and the like. Examples of the tertiary amines are trimethylamine, triethylamine, tripropylamine, tributylamine, triamylamine, triallylamine, dimethylaniline, diethylaniline, tribenzylamine, triphenylamine, benzyldimethylamine, and the like. Among them, diethylamine, dimethylbenzylamine, triethylamine are preferable.

Since the secondary and/or tertiary amines are superior to primary amines in solubility in an oil system, the former has greater catalytic effects than the latter. Further since the secondary and/or tertiary amines disperse uniformly in the reaction solution, stable catalytic action can be obtained.

As formaldehyde, formalin (an aqueous solution of formaldehyde), paraformaldehyde, hexamethylenetetramine, and other compounds which can generate formaldehyde can be used.

As the phenols, phenol, alkyl phenols such as m-cresol, p-cresol, o-cresol, t-butylphenol, nonylphenol, octylphenol, and the like, can be used. Further the compounds of the formula (I) as mentioned above can also be used as the phenols to be added in the later stage. Among them, phenol, m-cresol, p-cresol, o-cresol, nonylphenol are preferable.

The reaction between the compound of the formula (I) and the epoxidized vegetable oil is carried out in the presence of one or more secondary and/or tertiary amines with heating, preferably at a temperature of from about 80° C. to 160° C., for about 3–9 hours. It is preferable to stop the reaction when the amount of unreacted epoxidized vegetable oil becomes less than 30%, more preferably 5% by weight or less, by measuring molecular weight distribution of the reaction product by using high-speed liquid gel permeation chromatography (HLC). It is preferable to react the epoxidized vegetable oil with the compound of the formula (I) in a ratio of the epoxy group to the phenolic hydroxyl group in the range of 1:0.5 to 1:8, more preferably 1:1 to 1:3. If the ratio is larger than 1:0.5, i.e. the phenolic hydroxyl group being less than the epoxy group, the two hydroxyl groups of the compound of the formula (I) may react with the epoxy group of the oil to produce a polymer of oil in a large amount while the compound of the formula (I) may act as a crosslinking agent. Such a polymer resembles a non-reaction type plasticizer and shows a greater plasticizing effect, but a product using such a polymer is lowered in such properties as solvent resistance, insulation resistance, heat resistance and the like. On the other hand, if the ratio is less than 1:8, i.e. the phenolic hydroxyl group being more than 8 times as many as the epoxy group, one of the hydroxyl groups of the compound of the formula (I) may add to the epoxy group of the oil to produce an adduct in a large amount. Such an adduct resembles a reaction type plasticizer and a product using such an adduct is not lowered in physical and chemical properties, but plasticizing effect is lowered.

If required, the reaction between the compound of the formula (I) and the epoxidized vegetable oil may be carried out in a solvent such as toluene, xylenes, benzene, and the like.

Formaldehyde can be added to the reaction system from the beginning of the reaction, or at any time during the reaction or after the completion of the reaction of the compound of the formula (I) with the epoxidized vegetable oil. It is preferable to react the compound of the formula (I) with the epoxidized vegetable oil first (in a first stage), and to add formaldehyde to the reaction system at a later stage to proceed a second stage reaction. If the three ingredients are reacted simultaneously, it is very possible that some epoxy groups in the epoxidized vegetable oil are retained unreacted. On the other hand, if formaldehyde is added to the reaction system later, the epoxy groups react sufficiently.

It is preferable to react 0.5 to 4.0 equivalents of formaldehyde with one equivalent of the compound of the formula (I). If formaldehyde is less than 0.5 equivalent, it takes a long time for synthesizing a varnish and curing rate of the resulting resin becomes very slow. If formaldehyde is more than 4 equivalents, unreacted formaldehyde may remain in the resulting varnish in cosiderable amount, this is unpreferable.

It is important to carry out at least the reaction between the compound of the formula (I) and the epoxidized vegetable oil in the presence of one or more secondary and/or tertiary amines. It is preferable to use the secondary and/or tertiary amines in an amount of 0.5 to 5.0% by weight, more preferably 0.8 to 3.0% by weight, based on the total weight of the compound of the formula (I) and the epoxidized vegetable oil. If the amount is less than 0.5% by weight, it takes a long time for the reaction and unreacted epoxidized vegetable oil is easily retained in the reaction solution. If the amount is more than 5.0% by weight, the reaction proceeds too fast to easily form gels and it is very difficult to control the end of the reaction.

If desired, one or more phenols can be added to the reaction system preferably at a later stage, either before or at the same time as the addition of formaldehyde to the reaction system. The amount of the phenols to be added is preferably in the range of 1/0.1 to 1/20 in terms of the molar ratio of the phenols to the compound of the formula (I). Further, weight ratio of the epoxidized oil to the compound of the formula (I) plus the phenols is preferably in the range of 0.1/1 to 2/1. As to the amount of formaldehyde, it is preferable to react 0.5 to 4.0 equivalents of formaldehyde with one equivalent of the total of the compound of the formula (I) and the phenols by the same reasons as mentioned above.

In the case of adding one or more phenols to the reaction system after the completion of the reaction of the epoxidized vegetable oil with the compound of the formula (I) (i.e. the first stage reaction) before or together with the addition of formaldehyde, it is preferable to carry out the second stage reaction at a lower temperature than the first stage reaction, for example, at a temperature of 50° to 100° C. In the second stage reaction, a hydroxide or oxide of an alkali metal or alkaline earth metal or ammonia as well as a secondary or tertiary amine can be used as catalyst.

A total reaction time is not limited but usually in the range of 6 to 18 hours.

The internally plasticized phenolic resins thus produced can be used alone or as a mixture with conventional phenolic resins for preparing varnishes using a suitable solvent, or preparing prepregs by impregnating base materials such as glass fibers, glass paper, paper, and the like with the phenolic resins, or the like.

Laminates produced by molding such prepregs as mentioned above with heating and compression or laminates produced by molding base materials treated with the phenolic resins produced by the process of this invention are remarkably excellent in punchability as well as electrical properties, heat resistance, and solvent resistance.

The following examples will further explain the present invention.

EXAMPLES 1 TO 3 Comparative Example 1

Resins (A), (B), (C), (D) and (E) were prepared as follows.

RESIN (A)

(Epoxidized soya bean oil-bisphenol A modified phenolic resin)

In a 3 liter flask equipped with a reflux condenser, a thermometer, and a stirrer, 500 g of epoxidized soya bean oil, 800 g of bisphenol A and 26 g of dimethylbenzylamine were placed. The flask was heated on an oil bath and the reaction was carried out at 130° C. for 8 hours. After the completion of the reaction, 197 g of 80% paraformaldehyde and 31.2 g of ammonia were added to the flask and the reaction was carried out at 80° C. for 3 hours. The resulting resin had a gel time of 212 seconds measured on a hot plate (160° C.). The resin was dissolved in 450 g of methyl etkyl ketone to give a varnish, Resin (A).

RESIN (B)

(Epoxidized linseed oil-2-(4-hydroxyphenyl)-4-methyl-4-(4-hydroxyphenyl)-pentene-1 modified phenolic resin)

In a 3 liter flask equipped with a reflux condenser, a thermometer, and a stirrer, 500 g of epoxidized linseed oil, 300 g of 2-(4-hydroxyphenyl)-4-methyl-4-(4-hydroxyphenyl)-pentene-1 and 100 g of toluene were placed and heated at 100° C. for 30 minutes to give a uniform solution. After reducing the temperature to 70° C., 16 g of diethylamine was added to the flask and the reaction was carried out at 105° C. for 7 hours. After the completion of the reaction, 400 g of phenol, 200 g of o-cresol, 197 g of 80% paraformaldehyde, 40 g of 30% trimethylamine aqueous solution were added to the flask and the reaction was carried out at 75° C. for 5 hours. The resulting resin had a gel time of 205 seconds measured on a hot plate (160° C.). The resin was dissolved in 450 g of methyl ethyl ketone to give a varnish, Resin (B).

RESIN (C)

(Epoxidized linseed oil-bisphenol F modified phenolic resin)

In a 3 liter flask equipped with a reflux condenser, a thermometer, and a stirrer, 400 g of epoxidized linseed oil, 900 g of bisphenol F, 180 g of 90% paraformaldehyde and 30 g of diethylamine were placed and heated. The reaction was carried out at 110° C. until a gel time of the resulting resin became 210 seconds measured on a hot plate (160° C.). The resin was dissolved in 450 g of methyl ethyl ketone to give a varnish, Resin (C).

RESIN (D)

(Undercoating resin: a water soluble phenol resin)

Phenol (400 g), 600 g of a 37% formalin aqueous solution and 40 g of 30% triethylamine were reacted at 60° C. for 10 hours. After removing water under reduced pressure, methanol was added to the resulting resin to give a water soluble phenol resin varnish, Resin (D), containing 60% of non-volatile content.

RESIN (E)

(Tung oil modified phenolic resin)

In a 3 liter flask equipped with a reflux condenser, a thermometer, and a stirrer, 800 g of m-cresol, 450 g of tung oil, and 1 g of p-toluenesulfonic acid were placed and the reaction was carried out at 120° C. for 2 hours. After cooling the reaction solution to 70° C., 383 g of 80% paraformaldehyde, and 30 g of 25% ammonia water were added to the flask and the reaction was carried out for 5 hours while removing water under reduced pressure. The resulting resin had a gel time of 211 seconds measured on a hot plate (160° C.). The resin was dissolved in 400 g of methyl ethyl ketone to give a tung oil modified phenolic resin resol varnish, Resin (E).

Cotton linter paper was impregnated with Resin (D), the water soluble phenol resin, and dried to produce resin impregnated paper having 15% by weight of resin content. The resulting resin impregnated paper was further impregnated with Resin (A), (B), (C) or (E), and dried to produce resin impregnated paper having 48% by weight of resin content.

Eight sheets of the resin impregnated paper and one sheet of copper foil having a binding agent on one side were piled up and compressed at 160°–170° C. under 140 kg/cm² for 50 minutes to give a copper-clad laminate of 1.6 mm thick.

Physical and chemical properties of thus produced copper-clad laminates are as shown in Table 1.

TABLE 1

| Varnish | Example 1 Resin (A) | Example 2 Resin (B) | Example 3 Resin (C) | Comparative Example 1 Resin (E) |
|---|---|---|---|---|
| Insulation JIS-C6481 A resistance | $3.3 \times 10^{12}$ | $1.1 \times 10^{12}$ | $1.1 \times 10^{12}$ | $1.4 \times 10^{11}$ |
| (Ω) JIS-C6481 D-2/100 | $4.3 \times 10^{11}$ | $5.5 \times 10^{10}$ | $1.1 \times 10^{10}$ | $6.5 \times 10^{9}$ |
| Heat resistance in the air (at 200° C.) | Over 60 minutes No change | Over 60 minutes No change | 40 minutes No change | 30 minutes No change |
| Heat resistance in solder at 260° C. (sec) | 56.8 | 50.0 | 41.5 | 33.8 |
| Solvent resistance (in trichloroethylene) JIS-C6481 D | Over 60 minutes No change | Over 60 minutes No change | 45 minutes No change | 30 minutes No change |
| Punchability JIS-C6481 A | | | | |
| Surface | 90 | 90 | 90 | 70 |
| Edge face | 70 | 70 | 90 | 70 |
| Hole (points/100) | 80 | 80 | 70 | 70 |
| Water absorption (%) JIS-C6481 D-24/23 | 0.59 | 0.66 | 0.77 | 0.82 |

As shown in Table 1, the laminates obtained by using the phenolic resins produced by this invention are superior to that obtained by using a conventional tung oil modified phenolic resin in electrical properties such as insulation resistance, thermal stability such as heat resistance in the air and heat resistance in solder, and solvent resistance. Further the laminates using the phenolic resins produced by this invention are also superior to that using the tung oil modified phenolic resin in punchability; this means that the epoxidized vegetable oil seems to play an important role for plasticizing phenolic resins.

EXAMPLE 4

In a three-necked flask equipped with a stirrer, a thermometer, and a condenser, 500 g of epoxidized soya bean oil, 400 g of bisphenol A, and 27 g of triethylamine were placed and reacted at 130° C. for 7 hours. After the completion of the reaction, the reaction solution was cooled to 90° C. and 400 g of phenol, 338 g of 80% paraformaldehyde and 31.2 g of 25% ammonia water were added to the flask. The reaction was carried out at 80° C. for 4 hours, while removing water under reduced pressure. The resulting resin had a gel time of 193 seconds measured on a hot plate (160° C.). The resin was dissolved in methyl ethyl ketone to give a varnish having a resin content of 52% by weight.

EXAMPLE 5

In the same flask as used in Example 4, 500 g of epoxidized linseed oil, 300 g of bisphenol A, and 22 g of dimethylbenzylamine were placed and reacted at 150° C. for 8 hours. After the completion of the reaction, the reaction solution was cooled to 70° C. and 300 g of phenol, 254 g of paraformaldehyde, and 26.4 g of 25% ammonia water were added to the flask. The reaction was carried out at 80° C. for 4.5 hours. The resulting resin had a gel time of 183 seconds measured on a hot plate (160° C.). The resin was dissolved in methyl ethyl ketone to give a varnish having a resin content of 52% by weight.

EXAMPLE 6

In the same flask as used in Example 4, 500 g of epoxidized linseed oil, 500 g of bisphenol A, and 30 g of triethylamine were placed and reacted at 130° C. for 3 hours. Subsequently, 315 g of m-cresol was added to the flask and the reaction was continued for additional 5 hours. After the completion of the reaction, the reaction solution was cooled to 70° C. and 230 g of paraformaldehyde and 27.1 g of a 30% trimethylamine aqueous solution were added to the flask. The reaction was carried out at 80° C. for 8 hours. The resulting resin had a gel time of 245 seconds measured on a hot plate (160° C.). The resin was dissolved in acetone to give a varnish having a resin content of 52% by weight.

Production of Undercoating Resin (A water soluble phenol resin)

Phenol (400 g), 800 g of a 37% formalin aqueous solution, and 5 g of magnesium hydroxide were reacted at 55° C. for 8 hours. After removing water under reduced pressure, methanol was added to the resulting resin to give a water soluble phenol resin varnish having a resin content of 15% by weight.

Properties of Copper-clad Laminates

Copper-clad laminates were produced in the same manner as described in Examples 1 to 3 using individual varnishes obtained in Examples 4 to 6 and the undercoating resin mentioned above.

Physical and chemical properties of thus produced copper-clad laminates are as shown in Table 2.

TABLE 2

|  | Example 4 | Example 5 | Example 6 |
| --- | --- | --- | --- |
| Insulation JIS-C6481 A | $3.3 \times 10^{12}$ | $4.2 \times 10^{11}$ | $7.8 \times 10^{12}$ |
| resistance JIS-C6481 (Ω) D-2/100 | $1.2 \times 10^{11}$ | $2.0 \times 10^{10}$ | $1.4 \times 10^{11}$ |
| Heat resistance in the air (at 200° C.) | Over 60 minutes No change | Over 60 minutes No change | Over 60 minutes No change |
| Heat resistance in solder at 260° C. (sec) | 62.6 | 41.4 | 60.2 |
| Solvent resistance (in trichloroethylene) JIS-C6481 D | Over 60 minutes No change | Over 60 minutes No change | Over 60 minutes No change |
| Punchability JIS-C6481 A Surface | 80 | 90 | 85 |
| Edge face | 80 | 85 | 80 |
| Hole (points/100) | 80 | 80 | 80 |
| Water absorption (%) JIS-C6481 D-24/23 | 0.65 | 0.59 | 0.69 |

As shown in Table 2, the laminates obtained by using the phenolic resins produced by the process of this invention are remarkably excellent in punchability as well as electrical properties, heat resistance, and solvent resistance.

What is claimed is:

1. A process for producing an internally plasticized phenolic resin which comprises reacting a compound of the formula

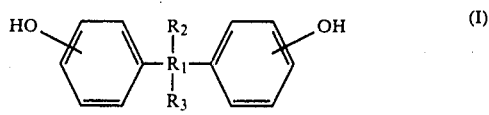 (I)

wherein $R_1$ is an alkylene residue having 1 to 3 carbon atoms; and $R_2$ and $R_3$ are independently hydrogen or a saturated or unsaturated hydrocarbon group having 1 to 3 carbon atoms, or $R_1$, $R_2$ and $R_3$ together form a group of the formula:

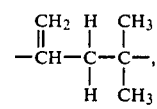

with an epoxidized vegetable oil with heating in the presence of one or more secondary and/or tertiary amines, and adding formaldehyde or one or more phenols and formaldehyde to the reaction system to further proceed the reaction.

2. A process according to claim 1, wherein the addition of formaldehyde or one or more phenols and formaldehyde to the reaction system is after the completion of the reaction of the compound of the formula (I) with the epoxidized vegetable oil.

3. A process according to claim 1 or 2, wherein the compound of the formula (I) is 4,4'-dihydroxydiphenylpropane-2,2.

4. A process according to claim 1 or 2, wherein the compound of the formula (I) is 2-(4-hydroxyphenyl)-4-methyl-4-(4-hydroxyphenyl)-pentene-1.

5. A process according to claim 1, wherein the reaction is carried out at a temperature of from 80° to 160° C.

6. A process according to claim 1 or 5, wherein 0.5 to 4.0 equivalents of formaldehyde is reacted with one equivalent of the compound of the formula (I) or one equivalent of the total of the compound of the formula (I) and one or more phenols.

7. A process according to claim 1, wherein the epoxidized vegetable oil is reacted with the compound of the formula (I) in a ratio of 1:0.5 to 1:8 in terms of the ratio of the epoxy group to the phenolic hydroxyl group.

8. A process according to claim 7, wherein the epoxidized vegetable oil is reacted with the compound of the formula (I) in a ratio of 1:1 to 1:3 in terms of the ratio of the epoxy group to the phenolic hydroxyl group.

9. A process according to claim 1, wherein the secondary and/or tertiary amines are used in an amount of 0.5 to 5.0% by weight based on the total weight of the compound of the formula (I) and the epoxidized vegetable oil.

10. A process according to claim 1 or 9, wherein the secondary and/or tertiary amines are diethylamine or dimethylbenzylamine.

11. A process according to claim 9, wherein the secondary and/or tertiary amines are used in an amount of 0.8 to 3.0% by weight based on the total weight of the compound of the formula (I) and the epoxidized vegetable oil.

12. A process according to claim 1, wherein said epoxidized vegetable oil is selected from the group consisting of epoxidized linseed oil, epoxidized soya bean oil, epoxidized castor oil and epoxidized dehydrated castor oil.

13. A process according to claim 1, wherein the epoxidized vegetable oil is epoxidized soya bean oil or epoxidized linseed oil.

14. A process according to claim 1, wherein said compound of the formula (I) is selected from the group consisting of 4,4'-dihydroxydiphenylpropane-2,2; 4,4'-dihydroxydiphenylmethane; 4,4'-dihydroxydiphenylcyclohexane; 4,4'-dihydroxydiphenylpentane-3,3; 4,4'-dihydroxydiphenylbutane-2,2; and 2-(4-hydroxyphenyl)-4-methyl-4-(4-hydroxyphenyl)-pentene-1.

15. A process according to claim 1, wherein said one or more secondary and/or tertiary amines is selected from the group consisting of dimethylamine, diethylamine, dipropylamine, dibutylamine, diallylamine, diamylamine, trimethylamine, triethylamine, tripropylamine, tributylamine, triamylamine, triallylamine, dimethylaniline, diethylaniline, tribenzylamine, triphenylamine and benzyldimethylamine.

16. An internally plasticized phenolic resin produced by the process of claim 1.

17. A process for producing a modified phenolic resin for producing laminates which comprises reacting a compound having two phenolic hydroxyl groups of the formula:

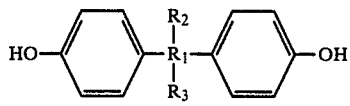

wherein $R_1$ is $C_1-C_3$ alkylene; and $R_2$ and $R_3$ are independently $C_1-C_3$ saturated or unsaturated hydrocarbon group or hydrogen, an epoxidized vegetable oil and formaldehyde with heating in the presence of one or more secondary and/or tertiary amines.

18. A process for producing a modified phenolic resin for producing laminates which comprises reacting an epoxidized vegetable oil with a compound having two phenolic hydroxyl groups of the formula:

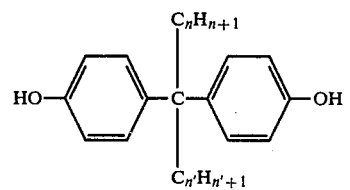

wherein n and n' are each zero or an integer of 1 to 4, with heating in the presence of one or more secondary and/or tertiary amines, and after the reaction adding one or more phenols and formaldehyde to produce a resol.

19. A method for producing laminates using the internally plasticized phenolic resin produced by the process of claim 1, comprising the steps of treating base materials with said phenolic resin and then molding said treated base materials to form said laminates.

20. A method for producing laminates using the internally plasticized phenolic resin produced by the process of claim 1, comprising the steps of impregnating base materials with said phenolic resin and molding the impregnated base materials with heating and compression to form said laminates.

* * * * *